United States Patent
Satoh et al.

(10) Patent No.: US 10,756,011 B2
(45) Date of Patent: Aug. 25, 2020

(54) POWER SEMICONDUCTOR MODULE, ELECTRONIC DEVICE, AND METHOD FOR CONTROLLING POWER SEMICONDUCTOR MODULE

(71) Applicant: SHARP KABUSHIKI KAISHA, Sakai, Osaka (JP)

(72) Inventors: Tomotoshi Satoh, Sakai (JP); Hiroyuki Komeda, Sakai (JP); Kenichi Tanaka, Sakai (JP); Koichiro Fujita, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/186,888

(22) Filed: Nov. 12, 2018

(65) Prior Publication Data

US 2019/0148281 A1 May 16, 2019

(30) Foreign Application Priority Data

Nov. 15, 2017 (JP) .................. 2017-219666

(51) Int. Cl.
*H01L 23/498* (2006.01)
*H01L 25/16* (2006.01)
*H01L 23/00* (2006.01)
*H02M 3/158* (2006.01)
(Continued)

(52) U.S. Cl.
CPC .. *H01L 23/49838* (2013.01); *H01L 23/49811* (2013.01); *H01L 24/17* (2013.01); *H01L 25/16* (2013.01); *H01L 24/16* (2013.01); *H01L 28/40* (2013.01); *H01L 29/7786* (2013.01); *H01L 2224/16225* (2013.01); *H01L 2224/16227* (2013.01); *H01L 2224/17106* (2013.01); *H01L 2924/00014* (2013.01); *H01L 2924/1033* (2013.01); *H01L 2924/1304* (2013.01); *H01L 2924/13064* (2013.01); *H01L 2924/15192* (2013.01); *H01L 2924/15322* (2013.01); *H01L 2924/19041* (2013.01);
(Continued)

(58) Field of Classification Search
CPC ................................. H01L 23/49838
See application file for complete search history.

(56) References Cited

U.S. PATENT DOCUMENTS

2010/0127389 A1* 5/2010 Obiraki ................ H01L 23/142
257/712
2014/0159225 A1 6/2014 Zushi et al.
2016/0352247 A1* 12/2016 Li .......................... H01L 25/072

FOREIGN PATENT DOCUMENTS

JP 5798412 B2 10/2015
WO 2014/091608 A1 6/2014

* cited by examiner

*Primary Examiner* — William A Harriston
(74) *Attorney, Agent, or Firm* — ScienBiziP, P.C.

(57) ABSTRACT

In a power semiconductor module, a first conductive layer including first to fourth electrodes are formed on one of principal surfaces of an insulating layer, and a conductive substrate functioning as a second conductive layer is formed on the other one of principal surfaces. Current paths are switched by controlling switching of a first transistor and a second transistor disposed on a surface of the first conductive layer thereby performing a power conversion. A capacitor is connected, in a region, between the first electrode and the second electrode. When a current flows in the region through the second conductive layer, a charging/discharging current occurs in the capacitor, which results in magnetic field cancellation.

8 Claims, 14 Drawing Sheets

(51) Int. Cl.
  *H01L 29/778* (2006.01)
  *H01L 49/02* (2006.01)
(52) U.S. Cl.
  CPC ... *H01L 2924/19105* (2013.01); *H02M 3/158* (2013.01); *H02M 3/1582* (2013.01)

POWER SEMICONDUCTOR MODULE, ELECTRONIC DEVICE, AND METHOD FOR CONTROLLING POWER SEMICONDUCTOR MODULE

BACKGROUND

1. Field

The present disclosure relates to a power semiconductor module and an electronic device including a power semiconductor module.

2. Description of the Related Art

A power semiconductor module, capable of handling a high voltage and a large current and used in power conversion or the like, is a device widely used in various electronic devices. Conventional power semiconductor modules are disclosed, for example, in International Publication No. 2014/091608 and Japanese Patent No. 5798412.

In the power semiconductor modules disclosed in International Publication No. 2014/091608 and Japanese Patent No. 5798412, a first conductive layer is formed on one surface of an insulating layer, and a second conductive layer is formed on the other surface of the insulating layer. This structure may be realized, for example, by forming the insulating layer on a conductive substrate used as the second conductive layer, and further forming the first conductive layer on the insulating layer. The first conductive layer and the second conductive layer are connected to each other via a throughhole formed in the insulating layer. On a surface of the first conductive layer, switching devices (a high-side transistor and a low-side transistor) and external connection terminals are disposed. These power semiconductor modules are capable of performing power conversion by controlling switching of the high-side transistor and the low-side transistor.

FIG. 14 is a cross-sectional view schematically illustrating a structure of the power semiconductor module disclosed in International Publication No. 2014/091608.

In the power semiconductor module shown in FIG. 14, an insulating layer 821 is formed on a conductive substrate 801 functioning as a second conductive layer, and first to fourth electrodes 811 to 814 are formed in a first conductive layer on the insulating layer 821. In this power semiconductor module, the first to fourth electrodes 811 to 814 are arranged in one line in this order (from left to right in FIG. 14). The first electrode 811 and the fourth electrode 814 are connected to the conductive substrate 801 via throughholes formed in the insulating layer 821.

A low-side transistor 832 is connected between the second electrode 812 and the third electrode 813. A high-side transistor 831 is connected between the third electrode 813 and the fourth electrode 814. The high-side transistor 831 and the low-side transistor 832 each turn on/off by being controlled according to a control signal input to a control terminal (not shown).

A first external connection terminal 841 is disposed in a vertically extending manner on the first electrode 811. A second external connection terminal 842 is disposed in a vertically extending manner on the second electrode 812. A third external connection terminal 843 is disposed in a vertically extending manner on the third electrode 813.

The power semiconductor module shown in FIG. 14 is configured, by way of example, so as to operate as a down-converter. In this case, a power supply 851 is connected between the first external connection terminal 841 and the second external connection terminal 842, and a load 852 and an inductor 853 are connected in series between the second external connection terminal 842 and the third external connection terminal 843. The inductor 853 is disposed between the third external connection terminal 843 and the load 852. In many cases, to achieve stability of the down-converter, a smoothing capacitor is connected in parallel to the load 852. However, the smoothing capacitor is not related to the present technical subject, and thus no smoothing capacitor is shown. In this structure, the second external connection terminal 842 functions as an external connection terminal for connection with a power supply and also as an external connection terminal for outputting power. Note that in FIG. 14, open arrows indicate a path along which a current flows when the high-side transistor 831 is in an on state (the low-side transistor 832 is in an off state), while solid arrows indicate a path along which a current flows when the low-side transistor 832 is in an on state (the high-side transistor 831 is in an off state).

FIG. 15 is a cross-sectional view schematically illustrating a structure of the power semiconductor module disclosed in Japanese Patent No. 5798412.

In the power semiconductor module shown in FIG. 15, an insulating layer 921 is formed on a conductive substrate 901 functioning as a second conductive layer, and first to fourth electrodes 911 to 914 are formed in a first conductive layer on the insulating layer 921. In this power semiconductor module, the fourth electrode 914, the third electrode 913, the first electrode 911, and the second electrode 912 are arranged in one line in this order (from left to right in FIG. 15). The second electrode 912 and the fourth electrode 914 are connected to the conductive substrate 901 via a throughhole formed in the insulating layer 921.

A high-side transistor 931 is connected between the first electrode 911 and the third electrode 913. A low-side transistor 932 is connected between the third electrode 913 and the fourth electrode 914. The high-side transistor 931 and the low-side transistor 932 each turn on/off by being controlled according to a control signal input to a control terminal (not shown).

A first external connection terminal 941 is disposed in a vertically extending manner on the first electrode 911. A second external connection terminal 942 is disposed in a vertically extending manner on the second electrode 912. A third external connection terminal 943 is disposed in a vertically extending manner on the third electrode 913.

The power semiconductor module shown in FIG. 15 is configured, by way of example, so as to operate as a down-converter. In this case, a power supply 951 is connected between the first external connection terminal 941 and the second external connection terminal 942, and a load 952 and an inductor 953 are connected in series between the second external connection terminal 942 and the third external connection terminal 943. The inductor 953 is disposed between the third external connection terminal 943 and the load 952. In many cases, to achieve stability of the down-converter, a smoothing capacitor is connected in parallel to the load 952. However, the smoothing capacitor is not related to the present technical subject, and thus no smoothing capacitor is shown. In this structure, the second external connection terminal 942 functions as an external connection terminal for connection with a power supply and also as an external connection terminal for outputting power. Note that in FIG. 15, open arrows indicate a path along which a current flows when the high-side transistor 931 is in the on state (the low-side transistor 932 is in the off state), while solid arrows indicate a path along which a current flows when the low-side transistor 932 is in the on state (the high-side transistor 931 is in the off state).

In power semiconductor modules in which power conversion is performed by turning on/off switching devices, switching noise generally occurs. Thus, a reduction in switching noise may be necessary. The power semiconductor modules shown in FIG. 14 and FIG. 15 include some structure that allows it to reduce switching noise to a certain degree.

More specifically, in a region A11 shown in FIG. 14, when the high-side transistor 831 turns on, a current flows through the second conductive layer (the conductive substrate 801) in a direction opposite to a direction in which a current flows through the first conductive layer (the third electrode 813 and the fourth electrode 814). On the other hand, in a region A21 shown in FIG. 15, when the low-side transistor 932 turns on a current flows through the second conductive layer (the conductive substrate 901) in a direction opposite to a direction in which a current flows through the first conductive layer (the third electrode 913 and the fourth electrode 914).

Therefore, in the region A11 and the region A21, when currents flow through these regions, cancellation occurs between a magnetic field generated by the current flowing through the first conductive layer and a magnetic field generated by the current flowing through the second conductive layer, which results in a reduction in switching noise generated in these regions.

In a region A12 shown in FIG. 14, when the high-side transistor 831 turns on, a current flows only through the second conductive layer (the conductive substrate 801), while when the low-side transistor 832 turns on, a current flows only through the first conductive layer (the second electrode 812 and the third electrode 813). On the other hand, in a region A22 shown in FIG. 15, when the high-side transistor 931 turns on, a current flows only through the first conductive layer (the first electrode 911 and the third electrode 913), while when the low-side transistor 932 turns on, a current flows only through the second conductive layer (the conductive substrate 901).

In the region A12 and the region A22, the current flowing through the first conductive layer and the current flowing the second conductive layer are the same in direction, and thus no cancellation occurs between magnetic fields generated by these currents. However, these currents flowing through the first conductive layer and the second conductive layer in the same direction pass through the inductors 853 and 953 and flow through the loads 852 and 952. Thus, as for the currents flowing through the first conductive layer and the second conductive layer, the inductors 853 and 953 cause changes in current to be suppressed and also cause speeds of changes to be slowed down such that the changes become small and gradual. As a result, a change in magnetic field caused by switching in each of the region A12 and the region A22 becomes small. Therefore, in the region A12 and the region A22, even if parasitic inductance exists in either region, the parasitic inductance has a small influence, and thus a reduction in switching noise generated in these regions is achieved.

On the other hand, in a region A13 shown in FIG. 14, when the high-side transistor 831 turns on, a current flows only through the second conductive layer (the conductive substrate 801), but no current flows when the low-side transistor 832 turns on. In a region A23 shown in FIG. 15, when the low-side transistor 932 turns on, a current flows only through the second conductive layer (the conductive substrate 901), but no current flows when the high-side transistor 931 turns on. As described above, when a current flows through the region A13 or region A23, the current flows only through the second conductive layer. As a result, in the region A13 and the region A23, a magnetic field generated by the current is not cancelled, which results in an occurrence of switching noise.

As described above, the conventional power semiconductor modules include regions (regions A13 and A23) where switching noise is not sufficiently suppressed, which may be a problem to be improved.

In view of the above, the present disclosure provides a power semiconductor module capable of more effectively reducing switching noise.

SUMMARY

According to a first aspect of the disclosure, there is provided a power semiconductor module in which a first conductive layer including a plurality of electrodes are formed on one of principal surfaces of an insulating layer, a second conductive layer is formed on the other principal surface, the first conductive layer and the second conductive layer are connected to each other via an opening formed in the insulating layer, a plurality of switching devices and a plurality of external connection terminals are disposed on a surface of the first conductive layer, and power conversion is performed by switching a current path by controlling switching of the switching devices, the power semiconductor module including at least one capacitor disposed on the first conductive layer such that the at least one capacitor connects arbitrary two electrodes in the plurality of electrodes to each other, the external connection terminals being configured to have a terminal structure in which in a state in which a power supply and a load are connected such that a particular power conversion operation is performed by the power semiconductor module, when a current flows through the second conductive layer at a location opposing the capacitor, a charging/discharging current occurs in the capacitor in a direction opposite to the direction of the current flowing through the second conductive layer.

According to a second aspect of the present disclosure, there is provided a power semiconductor module including an insulating layer, a first conductive layer formed on one of principal surfaces of the insulating layer and including a plurality of electrodes, and a second conductive layer formed on the other one of the principal surfaces of the insulating layer, the first conductive layer including a first electrode connected to the second conductive layer via a first opening formed in the insulating layer, a second electrode and a third electrode either of which is not connected to the second conductive layer, and a fourth electrode connected to the second conductive layer via a second opening formed in the insulating layer, the power semiconductor module further including a capacitor connected between the first electrode and the second electrode, a first transistor connected between the second electrode and the third electrode, a second transistor connected between the third electrode and the fourth electrode, and first to fourth external connection terminals respectively connected to the first to fourth electrodes.

According to a third aspect of the present disclosure, there is provided a power semiconductor module including an insulating layer, a first conductive layer including a plurality of electrodes and formed on one of principal surfaces of the insulating layer, a second conductive layer formed on the other one of principal surfaces of the insulating layer, wherein the first conductive layer and the second conductive layer are connected to each other via an opening formed in the insulating layer, a plurality of switching devices and a plurality of external connection terminals are disposed on a surface of the first conductive layer, power conversion is performed by switching a current path by controlling switching of the switching devices, the switching of the switching devices is controlled such that two current paths are continuously and alternately switched, in one of two current paths, a current flows only through the first conductive layer, in the other one of two current paths, a current flows only through the second conductive layer, and the power semiconductor module includes a region in which the two currents flow in the same direction.

According to a fourth aspect of the present disclosure, there is provided an electronic device including the power semiconductor module according to the first aspect.

DESCRIPTION OF THE EMBODIMENTS

First Embodiment

Figure 1:
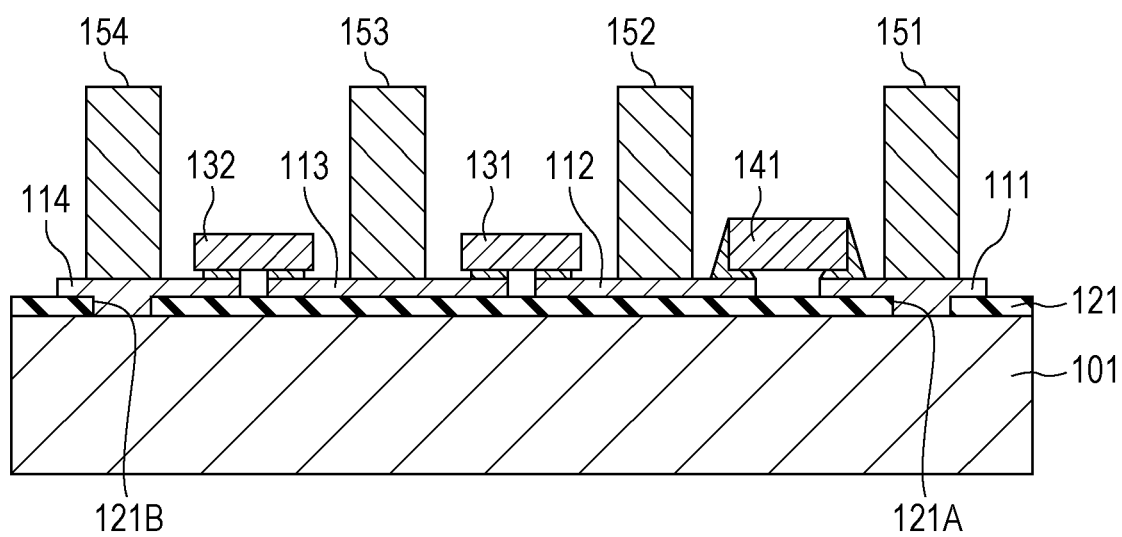
FIG. 1 is a cross-sectional view schematically illustrating a structure of a power semiconductor module according to a first embodiment.
Figure 2:
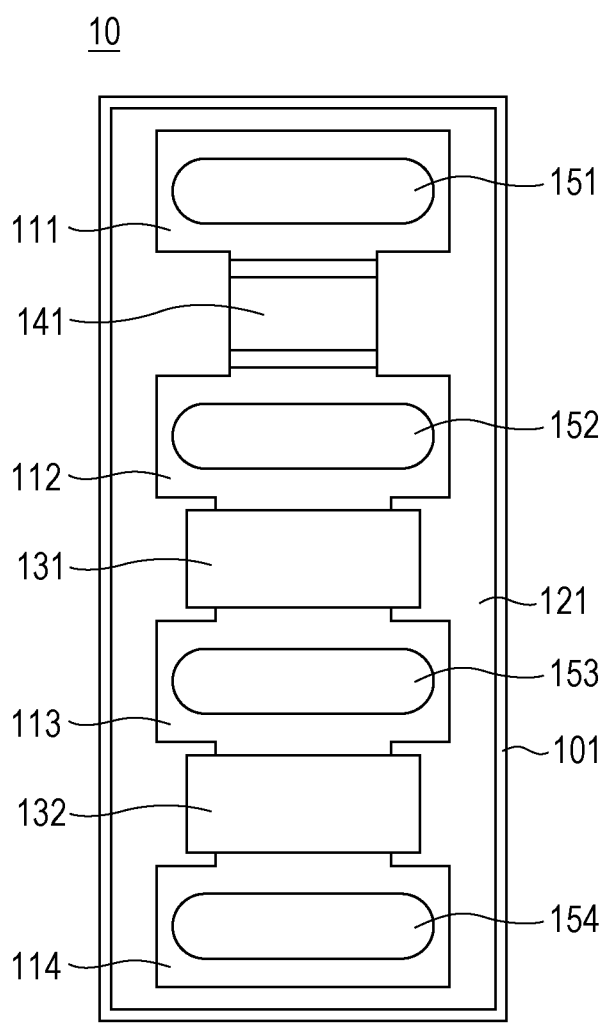
FIG. 2 is a plan view of the power semiconductor module shown in FIG. 1.
Figure 3A:
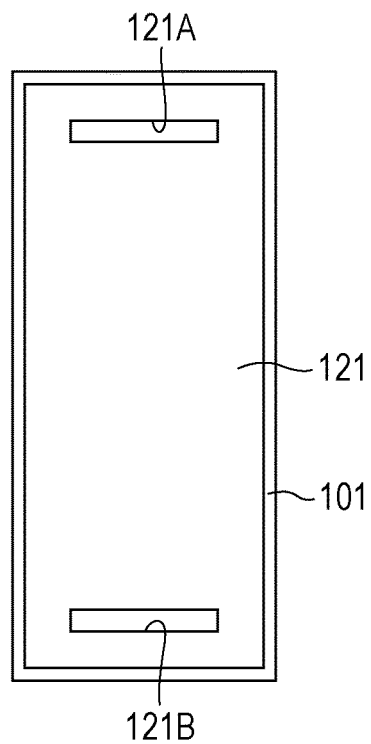
FIGS. 3A and 3B are plan views each illustrating a structure of the power semiconductor module shown in FIG. 1 in a middle of a production process.
Figure 3B:
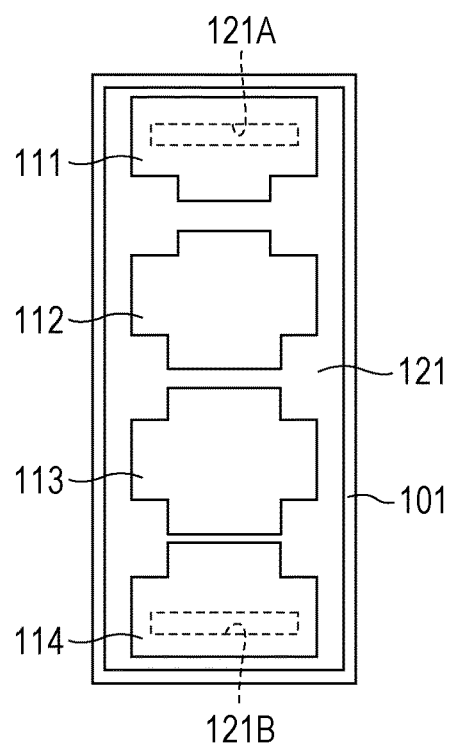

Embodiments of the present disclosure are described in detail with reference to drawings. FIG. 1 is a cross-sectional view schematically illustrating a structure of a power semiconductor module 10 according to a first embodiment. FIG. 2 is a plan view schematically illustrating a structure of the power semiconductor module 10. FIGS. 3A and 3B are plan views each illustrating a state of the power semiconductor module 10 in a middle of a production process.

In the power semiconductor module 10, an insulating layer 121 is formed on a conductive substrate (a second conductive layer) 101, and first to fourth electrodes 111 to 114 are formed in a first conductive layer on the insulating layer 121. FIG. 3A illustrates a shape of the insulating layer 121 formed on the conductive substrate 101. As shown in FIG. 3A, the insulating layer 121 has a first opening 121A and a second opening 121B respectively formed close to two ends as seen in a longitudinal direction of the power semiconductor module 10. Although in the example shown in FIG. 1, the second conductive layer is realized using the conductive substrate 101, and the first conductive layer is formed on the insulating layer 121 formed on the conductive substrate 101, the structure is not limited to this example. For example, an insulating substrate may be used instead of the insulating layer 121, and conductive films may be formed on both principal surfaces of the insulating substrate such that the conductive films function respectively as the first conductive layer and the second conductive layer. In this case, the first conductive layer and the second conductive layer are located such that they oppose each other via the insulating substrate.

FIG. 3B illustrates shapes of the first to fourth electrodes 111 to 114 formed on the insulating layer 121. As shown in FIG. 3B, the first to fourth electrodes 111 to 114 are formed such that they are isolated from each other and arranged in a substantially straight line along a longitudinal direction of the power semiconductor module 10 in the order from the first electrode 111 to the fourth electrode 114 (from top to bottom in FIG. 3B). The arrangement of the first to fourth electrodes 111 to 114 in the above-described manner may be a most effective arrangement, and it is possible to minimize the area size of the power semiconductor module 10. The first electrode 111 is disposed in a region including the first opening 121A, and the fourth electrode 114 is disposed in a region including the second opening 121B. That is, the first electrode 111 and the fourth electrode 114 are connected to the conductive substrate 101 via the first opening 121A and the second opening 121B.

A first transistor 131 is connected between the second electrode 112 and the third electrode 113. A second transistor 132 is connected between the third electrode 113 and the fourth electrode 114. The first transistor 131 and the second transistor 132 each turn on/off by being controlled according to a control signal input to a control terminal (not shown). That is, when the first transistor 131 is turned on, electrical continuity is formed between the second electrode 112 and the third electrode 113, while when the second transistor 132 is turned on, electrical continuity is formed between the third electrode 113 and the fourth electrode 114. There is no particular restriction on the types of first transistor 131 and the second transistor 132. For example, a GaN HEMT (High Electron Mobility Transistor) may be employed for each transistor. The first transistor 131 and the second transistor 132 may be mounted on the power semiconductor module 10 by using a flip-chip bonding technique.

A capacitor 141 is connected between the first electrode 111 and the second electrode 112. More specifically, one electrode of the capacitor 141 is connected to the first electrode 111, and the other electrode of the capacitor 141 is connected to the second electrode 112. As for the capacitor 141, a chip capacitor capable of being surface-mounted may be used.

First to fourth external connection terminals 151 to 154 are disposed in a vertically extending fashion respectively on the first electrode 111 to the fourth electrode 114. In this structure, it may be preferable that the first external connection terminal 151 is disposed just above the first opening 121A, and the fourth external connection terminal 154 is disposed just above the second opening 121B. In the power semiconductor module 10, a first terminal group is formed by the first external connection terminal 151 and the second external connection terminal 152, and a second terminal group is formed by the third external connection terminal 153 and the fourth external connection terminal 154.

Figure 4:
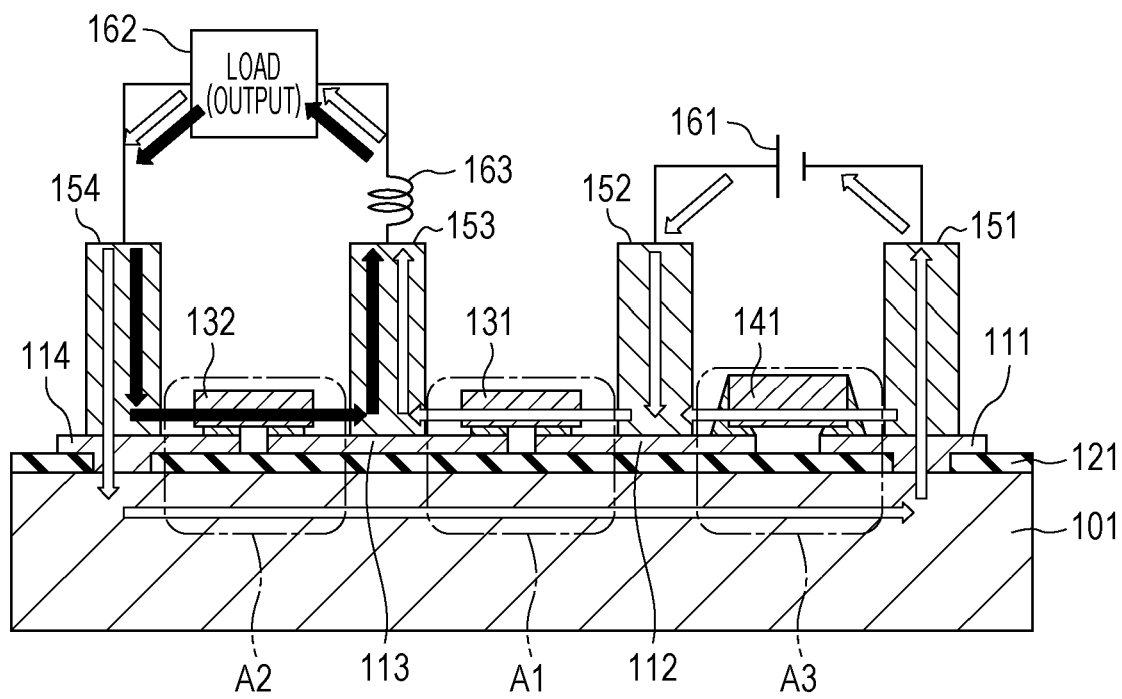
FIG. 4 is a diagram illustrating an effect of reducing switching noise in a case where the power semiconductor module shown in FIG. 1 is operated as a down-converter.

Next, a switching noise reduction effect in the power semiconductor module 10 is described below with reference to FIG. 4. FIG. 4 illustrates by way of example a case where the power semiconductor module 10 operates as a down-converter (a voltage step-down circuit) in an electronic device. In this case, a power supply 161 is connected to the first terminal group (the first external connection terminal 151 and the second external connection terminal 152) of the power semiconductor module 10, and a load 162 and an inductor 163 are connected in series to the second terminal group (the third external connection terminal 153 and the fourth external connection terminal 154. The inductor 163 is disposed between the third external connection terminal 153 and the load 162. In the down-converter, in many cases, a smoothing capacitor is connected in parallel to the load 163. However, the smoothing capacitor is not related to the present technical subject, and thus no smoothing capacitor is shown. The power supply 161 may be an internal power supply disposed in the electronic device or an external power supply that supplies power from the outside to the electronic device.

In FIG. 4, open arrows indicate a path along which a current flows when the first transistor 131 is in the on state (the second transistor 132 is in the off state), while solid arrows indicate a path along which a current flows when the second transistor 132 is in the on state (the first transistor 131 is in the off state).

In a region A1 (extending between the second electrode 112 and the third electrode 113 and further extending partially over the second electrode 112 and the third electrode 113) shown in FIG. 4, when the first transistor 131 turns on, currents flow through the second conductive layer (the conductive substrate 101) and the first conductive layer (the second electrode 112 and the third electrode 113) in opposite directions. Therefore, when the currents flow in the region A1 in the above-described manner, cancellation occurs between a magnetic field generated by the current flowing through the first conductive layer and a magnetic field generated by the current flowing through the second conductive layer, which results in a reduction in switching noise generated in this region.

On the other hand, in a region A2 (extending between the third electrode 113 and the fourth electrode 114 and further extending partially over the third electrode 113 and the fourth electrode 114) shown in FIG. 4, when the first transistor 131 turns on, a current flows only through the second conductive layer (the conductive substrate 101), while when the second transistor 132 turns on, a current flows only through the first conductive layer (the third electrode 113 and the fourth electrode 114). In the region A2, currents flow in the same direction through the first conductive layer and the second conductive layer, and thus no cancellation occurs between magnetic fields generated by these currents. However, these currents flowing through the first conductive layer and the second conductive layer in the same direction pass through the inductor 163 and flow through the load 162. Thus, as for the currents flowing through the first conductive layer and the second conductive layer, the inductor 163 causes changes in current to be suppressed and also causes speeds of changes to be slowed down such that the changes become small and gradual. As a result, in the region A2, the change in magnetic field caused by switching becomes small. Therefore, in the region A2, even if parasitic inductance exists in this region, the parasitic inductance has a small influence, which results in a reduction in switching noise generated in this region.

In a region A3 (extending between the first electrode 111 and the second electrode 112 and further extending partially over the first electrode 111 and the second electrode 112) shown in FIG. 4, when the first transistor 131 turns on, a current flows through the second conductive layer (the conductive substrate 101). Furthermore, in the power semiconductor module 10, a charging/discharging current occurs in the capacitor 141 when the first transistor 131 or the second transistor 132 is switched. That is, in the region A3, the charging/discharging current occurs in the capacitor 141 when the first transistor 131 turns on, and this causes a current to flow also through the first conductive layer (the first electrode 111 and the second electrode 112). In this state, the direction of the current flowing through the first conductive layer (the first electrode 111 and the second electrode 112) is opposite to the direction in which the current flows through the second conductive layer (the conductive substrate 101). Therefore, in the region A3, when a current flows through this region, cancellation occurs between a magnetic field generated by the current flowing through the first conductive layer and a magnetic field generated by the current flowing through the second conductive layer, which results in a reduction in switching noise generated in this region.

As can be seen from the above description, in the power semiconductor module 10 according to the first embodiment, the charging/discharging current occurring in the capacitor 141 is used to cancel magnetic fields thereby achieving a further larger effect of reducing switching noise than is achieved in the conventional power semiconductor modules. Furthermore, in the power semiconductor module 10, the first terminal group (the first external connection terminal 151 and the second external connection terminal 152) and the second terminal group (the third external connection terminal 153 and the fourth external connection terminal 154) have a total of four terminals without sharing any external connection terminal, which is another feature of the present embodiment.

Figure 14:
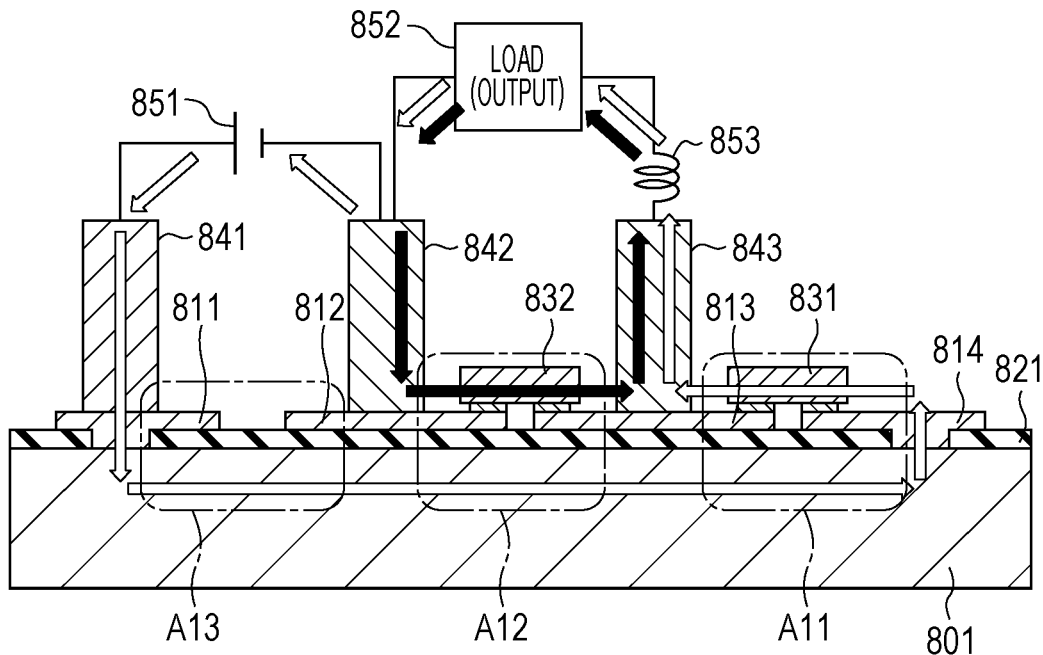
FIG. 14 is a cross-sectional view schematically illustrating a structure of a conventional power semiconductor module.
Figure 15:
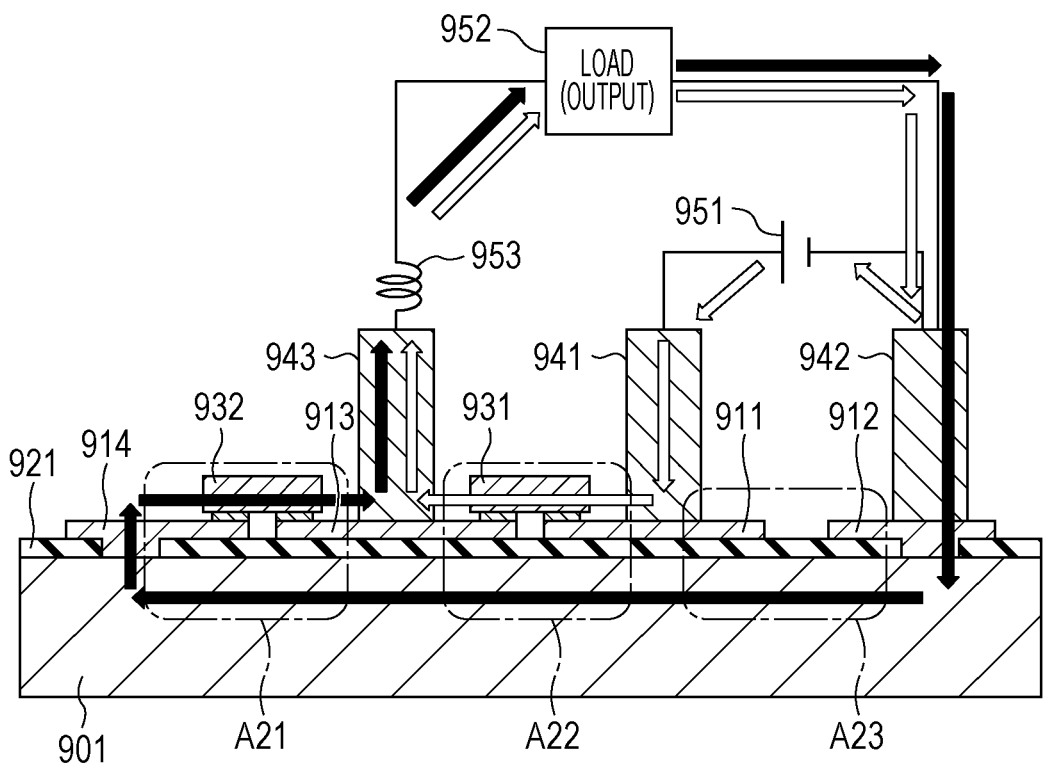
FIG. 15 is a cross-sectional view schematically illustrating a structure of a conventional power semiconductor module.

In comparison, in the conventional power semiconductor modules shown in FIG. 14 and FIG. 15, when a current flows through the second conductive layer (the conductive substrate 801 or the conductive substrate 901) in the region A13 or the region A23, the magnetic field generated by this current is not cancelled, and thus switching noise occurs.

Furthermore, in the conventional power semiconductor modules, even if a capacitor is disposed in the region A13 or the region A23, no charging/discharging current occurs in the capacitor, and thus a magnetic field cancellation effect is not obtained unlike the power semiconductor module 10. This is because the conventional power semiconductor modules have a three-terminal structure in which one of external connection terminals is shared by an external connection terminal for connection with a power supply and an external connection terminal for outputting.

For example, in the power semiconductor module shown in FIG. 14, the second external connection terminal 842 is shared by the external connection terminal for connection with the power supply and the external connection terminal for outputting. As a result, when the high-side transistor 831 is turned on and a current flows through the second conductive layer (the conductive substrate 801) in the region A13, the first electrode 811 is included in this current path but the second electrode 812 is not included in the current path. Therefore, even if a capacitor is disposed in the region A13 including the first electrode 811 and the second electrode 812, no charging/discharging current occurs in this capacitor.

Similarly, in the power semiconductor module shown in FIG. 15, the second external connection terminal 942 is shared by the external connection terminal for connection with the power supply and the external connection terminal for outputting. Therefore, when the low-side transistor 932 is turned on and a current flows through the second conductive layer (the conductive substrate 901) in the region A23, the second electrode 912 is included in this current path but the first electrode 911 is not included in the current path. Therefore, even if a capacitor is disposed in the region A23 including the second electrode 912 and the first electrode 911, no charging/discharging current occurs in this capacitor.

In contrast, in the power semiconductor module 10 according to the first embodiment, the external connection terminals are formed in the four-terminal structure. In this structure, when the first transistor 131 is turned on and a current flows through the second conductive layer (the conductive substrate 101) in the region A3, both the first electrode 111 and the second electrode 112 are included in the current path. Therefore, a charging/discharging current occurs in the capacitor 141 disposed in the region A3 extending between the first electrode 111 and the second electrode 112 and further extending partially over the first electrode 111 and the second elect rode 112.

In the power semiconductor module 10, as described above, switching noise is reduced in all regions A1 to A3, that is, there is no region in which switching noise is not reduced. That is, the power semiconductor module 10 provides a better switching noise reduction effect than is achieved in the conventional power semiconductor modules.

As described above, it may be preferable that the first transistor 131 and the second transistor 132 are mounted in the power semiconductor module 10 by using a flip-chip bonding technique. By mounting the first transistor 131 and the second transistor 132 using the flip-chip bonding technique, it is possible to limit a current distribution in the vertical direction (normal to the principal surface of the power semiconductor module 10) to a small range. As a result, the magnetic fields extend in a reduced region, which makes it possible to achieve a more effective cancellation of magnetic field.

Furthermore, it may be preferable that the first transistor 131 and the second transistor 132 are each a lateral transistor. By mounting the lateral transistor using the flip-chip bonding technique, it is possible to achieve a current distributed, in the transistor, in a region closer to the module substrate. As a result, the degree of spreading of magnetic fields is further reduced, which makes it possible to achieve more effective magnetic field cancellation. As for the first transistor 131 and the second transistor 132, Si (silicon) transistors or wide bandgap semiconductor transistors may be used.

Furthermore, in the power semiconductor module 10, it may be preferable to dispose the first external connection terminal 151 immediately above the first opening 121A such that the first external connection terminal 151 and the first opening 121A overlap with each other as seen in plan view thereby reducing the horizontal distance between the first opening 121A and the first external connection terminal 151. This makes it possible to reduce an ohmic loss, reduce an unnecessary current in the horizontal direction, suppress the spreading of magnetic fields, reduce parasitic inductance, and reduce noise. In a case where there is a deviation in relative horizontal position between the first opening 121A and the first external connection terminal 151, the magnetic field cancellation basically does not occur in a region between the first opening 121A and the first external connection terminal 151. For the same reason, it may be preferable to dispose the fourth external connection terminal 154 immediately above the second opening 121B.

FIGS. 5A and 5B and FIGS. 6A and 6B are graphs indicating switching noise reduction effects for the power semiconductor module 10 according to the first embodiment and for the power semiconductor module having the conventional structure (shown in FIG. 15). Herein, it is assumed that an input voltage Vin applied to the power semiconductor module is 250 V, and a target output voltage Vout is 125 V.

Figure 5A:
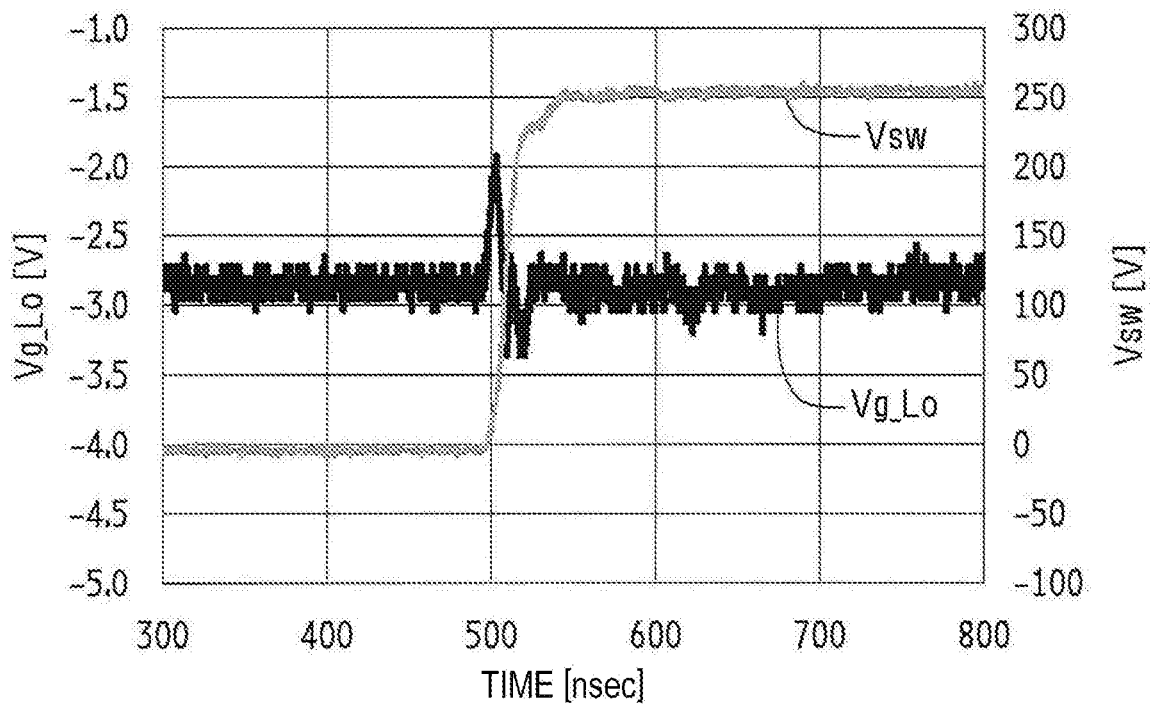
FIG. 5A is a graph illustrating an effect of reducing switching noise in a power semiconductor module shown in FIG. 15.
Figure 5B:
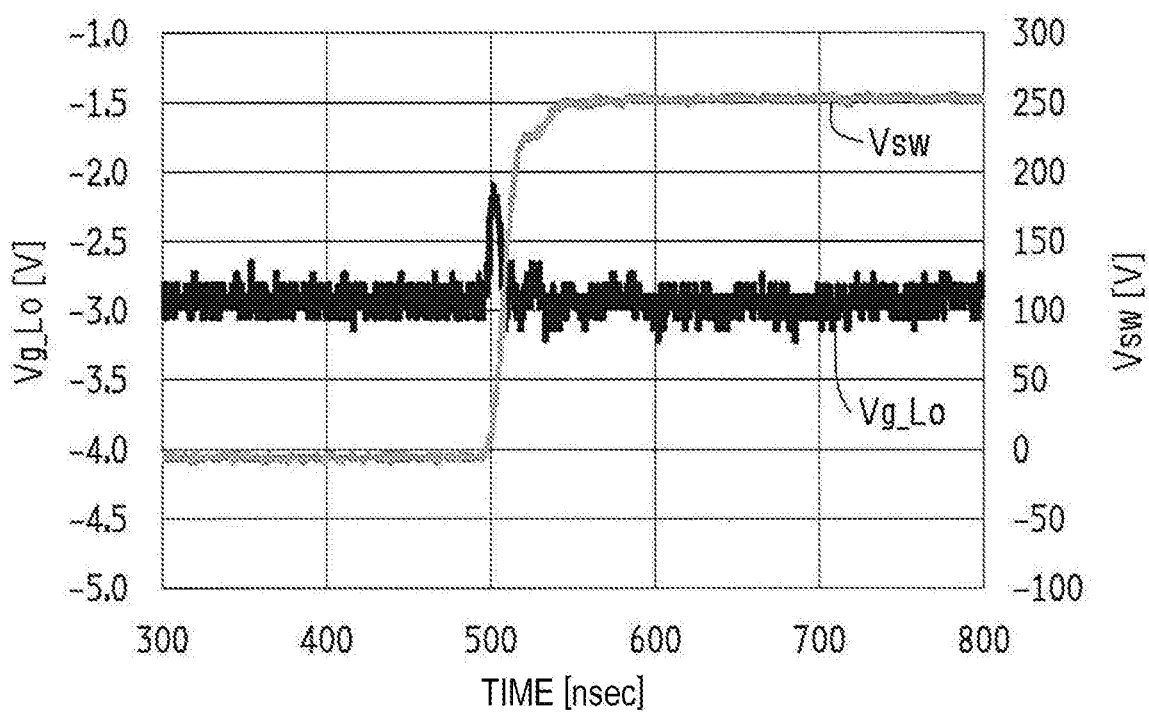
FIG. 5B is a graph illustrating an effect of reducing switching noise in a power semiconductor module shown in FIG. 1.

FIG. 5A shows voltage waveforms that occur in the power semiconductor module shown in FIG. 15 when the high-side transistor 931 is turned on from the off state and the low-side transistor 932 is turned off from the on state. FIG. 5B shows voltage waveforms that occur in the power semiconductor module 10 according to the first embodiment when the first transistor 131 is turned on from the off state and the second transistor 132 is turned off from the on state. In FIGS. 5A and 5B, Vsw represents a gate voltage (a control voltage) of the high-side transistor 931 or the first transistor 131, and Vg_Lo represents a difference between a target output voltage Vout and an actual output voltage of the power semiconductor module.

As can be seen from the graphs shown in FIGS. 5A and 5B, noise occurs on the waveform Vg_Lo when transistors are switched and correspondingly a change occurs in the current path along which a current flows in the power semiconductor module. In the power semiconductor module 10 according to the first embodiment, noise (shown in FIG. 5B) is smaller than noise that occurs in the conventional power semiconductor module (shown in FIG. 5A). More specifically, a positive noise peak is reduced to 80% (0.9 V to 0.7 V) of that which occurs in the conventional power semiconductor module, and a negative noise peak is reduced to substantially zero.

Figure 6A:
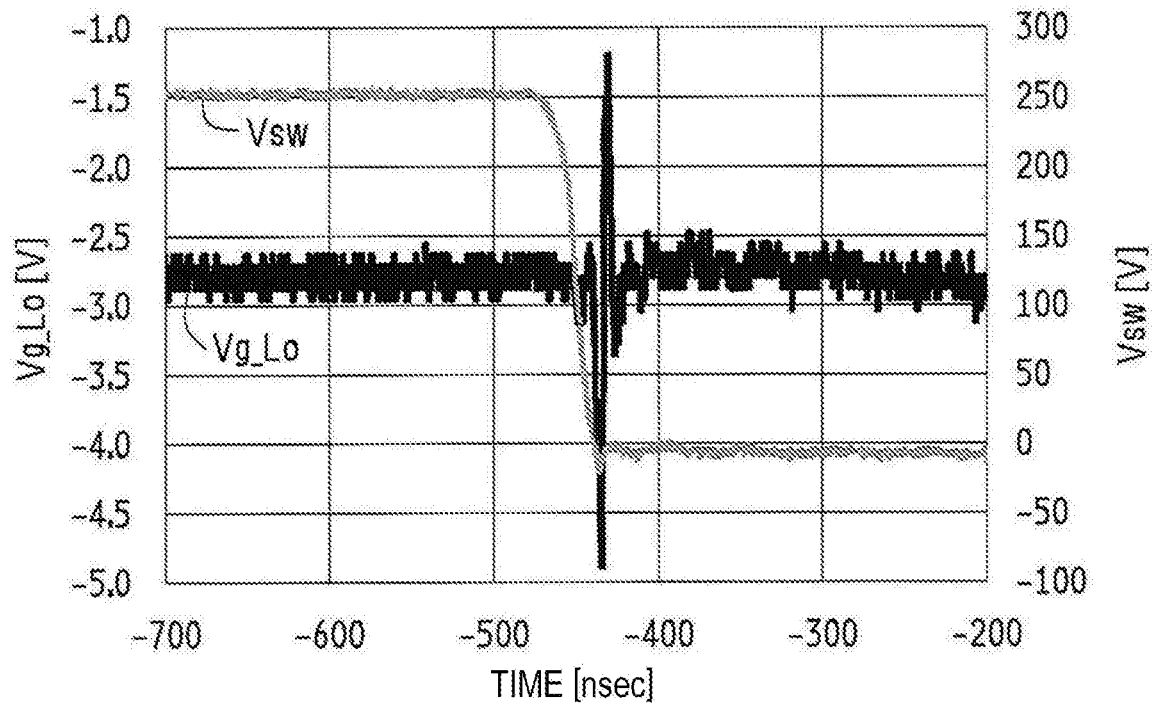
FIG. 6A is a graph illustrating an effect of reducing switching noise in a power semiconductor module shown in FIG. 15.
Figure 6B:
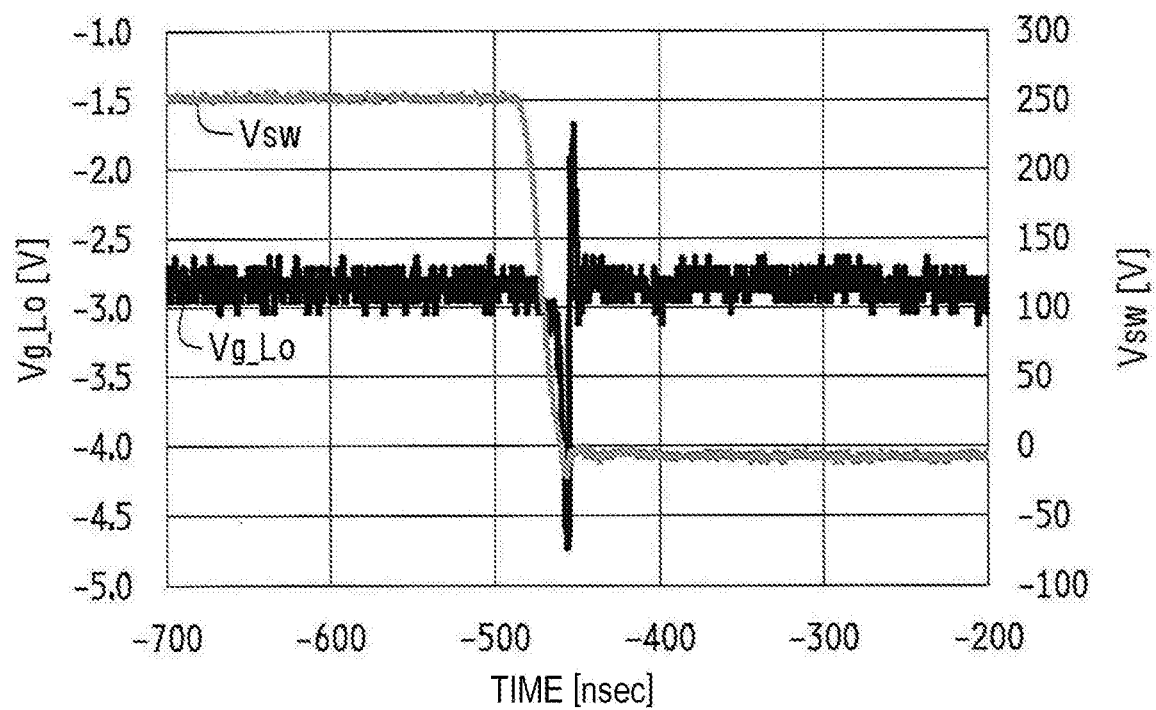
FIG. 6B is a graph illustrating an effect of reducing switching noise in a power semiconductor module shown in FIG. 1.

FIG. 6A shows voltage waveforms that occur in the power semiconductor module shown in FIG. 15 when the high-side transistor 931 is turned off from the on state and the low-side transistor 932 is turned on from the off state. FIG. 6B shows voltage waveforms that occur in the power semiconductor module 10 according to the first embodiment when the first transistor 131 is turned off from the on state and the second transistor 132 is turned on from the off state.

As can be seen from the graphs shown in FIGS. 6A and 6B, noise occurs on the waveform Vg_Lo when transistors are switched and correspondingly a change occurs in the current path along which a current flows in the power semiconductor module. In the power semiconductor module 10 according to the first embodiment, noise (shown in FIG. 6B) is smaller than noise that occurs in the conventional power semiconductor module (shown in FIG. 6A). More specifically, a positive noise peak is reduced to 70% (1.5 V to 1.1 V) of that which occurs in the conventional power semiconductor module, and a negative noise peak is reduced to 90% (2.1 V to 1.9 V).

Figure 7:
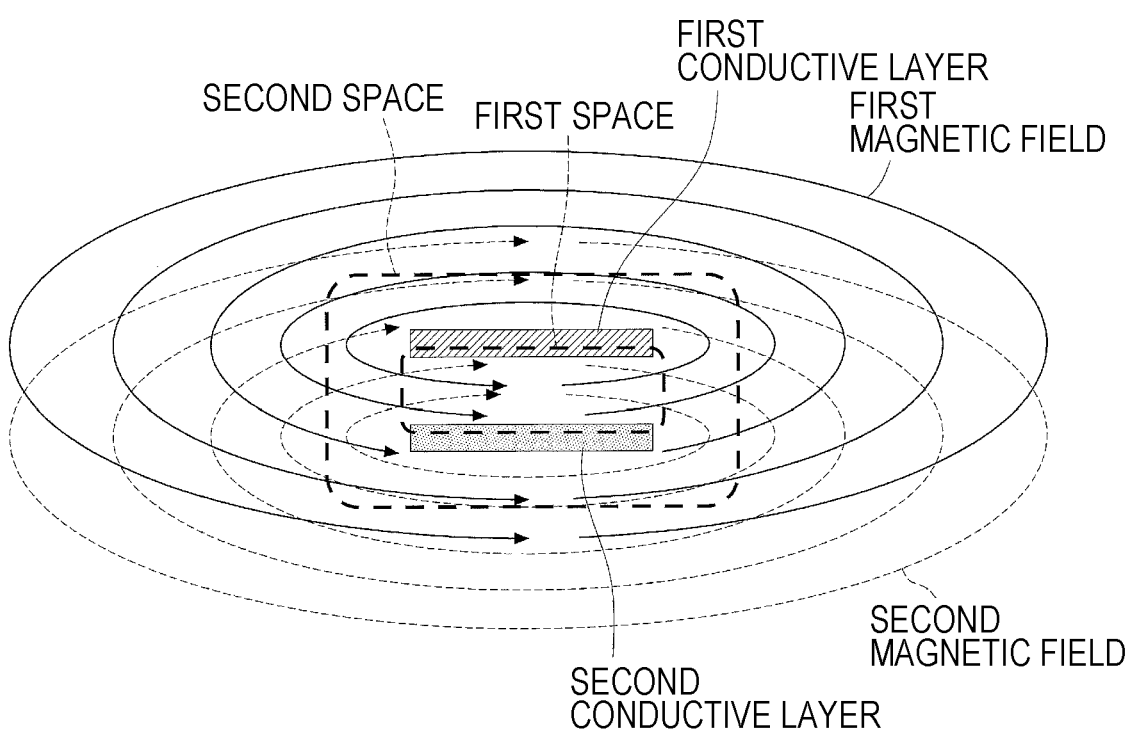
FIG. 7 is a cross-sectional view of a region where a magnetic field cancellation effect occurs, which is used as a base of a technique of cancelling magnetic fields in the power semiconductor module shown in FIG. 1.

FIG. 7 is a diagram illustrating a fundamental mechanism of magnetic field cancellation applied to the power semiconductor module 10. More specifically, FIG. 7 shows a cross-sectional view of a region where the magnetic field cancellation effect is obtained. In FIG. 7, it is assumed that a current flows through the first conductive layer in a direction from the back side to the front side of the page of FIG. 7. Note that in FIG. 7, solid-line arrows indicate a first magnetic field generated by a current flowing through the first conductive layer, while broken-line arrows indicate a second magnetic field generated by a current flowing through the second conductive layer.

In FIG. 7, a first space denotes a space between the first conductive layer and the second conductive layer. In this first space, the first magnetic field and the second magnetic field are the same in direction, and thus these magnetic fields strengthen each other. That is, in the first space, parasitic inductance occurs.

In FIG. 7, a second space denotes a space close to the first conductive layer and the second conductive layer. In this second space, the directions of the first magnetic field and the second magnetic field are opposite to each other. However, there is a relatively large difference in the magnetic field strength, and thus the magnetic field cancellation effect is rather weak, which causes residual parasitic inductance to occur. The second space has a vertical size (the size in a direction normal to the principal surface of the power semiconductor module 10) approximately equal to 2 times a vertical size of the first space.

In an outer space outside the second space, the first magnetic field and the second magnetic field are opposite in direction, and thus the magnetic fields are substantially cancelled out.

The fact described above indicates that in the power semiconductor module 10, small parasitic inductance and a large magnetic field cancellation effect may be achieved by reduce the first space and the second space shown in FIG. 7. The reduction in the first space and the second space is achieved by reducing the distance between the first conductive layer and the second conductive layer, that is, by reducing the thickness of the insulating layer 121.

Figure 8:
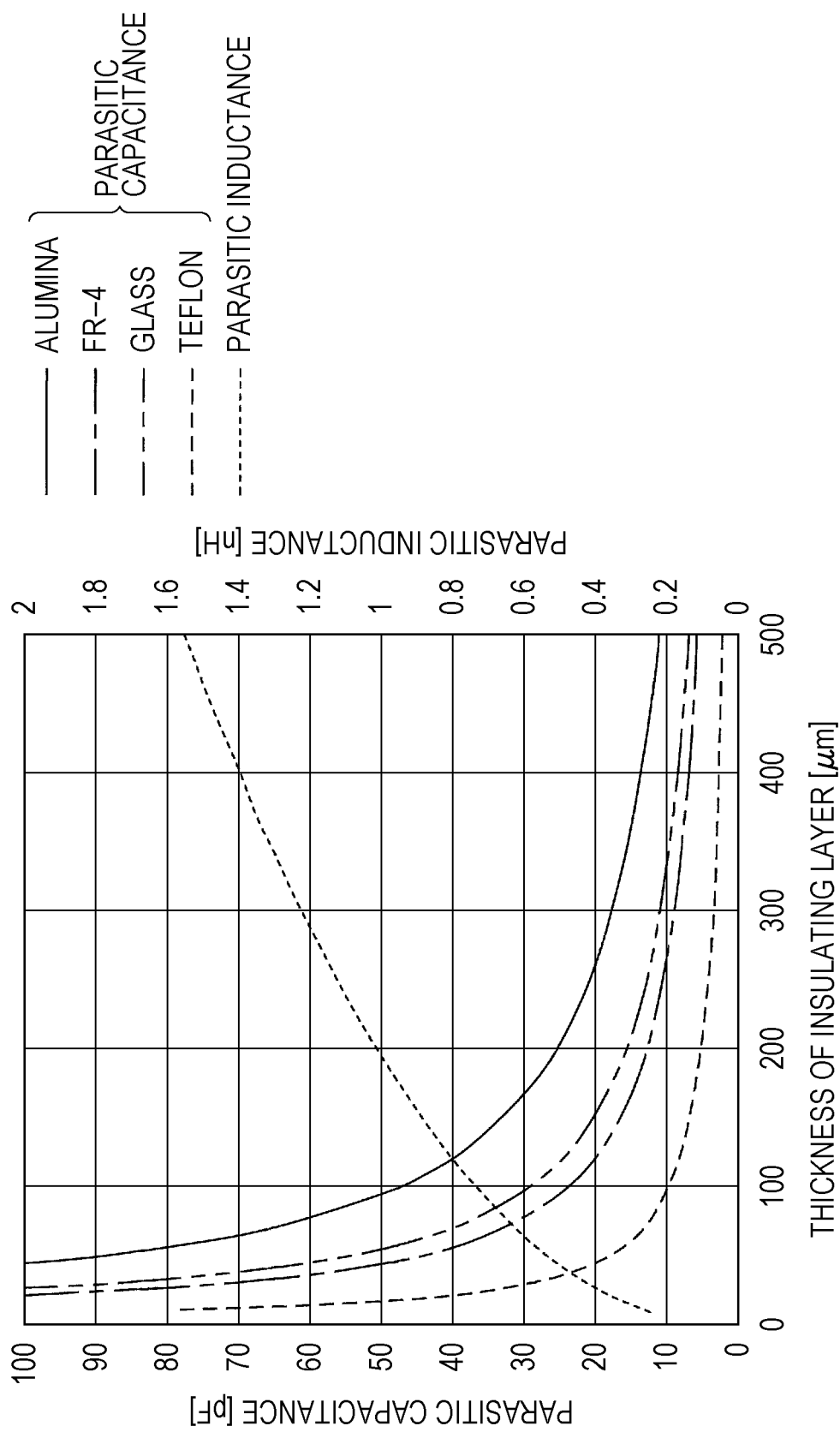
FIG. 8 is a graph indicating parasitic inductance and parasitic capacitance as a function of the thickness of an insulating layer in the power semiconductor module shown in FIG. 1.

FIG. 8 is a graph indicating parasitic inductance and parasitic capacitance as a function of the thickness of the insulating layer 121 in the power semiconductor module 10. As shown in FIG. 8, the parasitic inductance increases as the insulating layer thickness increases. That is, in the power semiconductor module 10, by reducing the insulating layer 121, it is possible to reduce the parasitic inductance and increase the magnetic field cancellation effect.

On the other hand, if the insulating layer thickness is reduced, the parasitic capacitance in the power semiconductor module 10 increases. Note that the parasitic capacitance also depends on the dielectric constant of the insulating material used in the insulating layer 121. Therefore, in FIG. 8, the parasitic capacitance is plotted for various insulating materials of the insulating layer 121, and more specifically, for alumina, FR-4, glass, Teflon (registered trademark). As shown in FIG. 8, the parasitic capacitance increases as the insulating layer thickness decreases. The increase in the parasitic capacitance may result in an undesirable effect, that is, an increase in ringing loss in the power semiconductor module 10.

In the power semiconductor module 10, the first conductive layer is formed on one of surfaces of the insulating layer 121, and the second conductive layer is formed on the other surface. In this structure, it may be desirable to reduce both the parasitic inductance and the parasitic capacitance between the first conductive layer and the second conductive layer to low levels as possible. However, as can be seen from FIG. 8, the parasitic inductance decreases as the thickness of the insulating layer 121 creases, while the parasitic capacitance increases as the thickness of the insulating layer 121 creases, and thus these conflict with each other.

Figure 9:
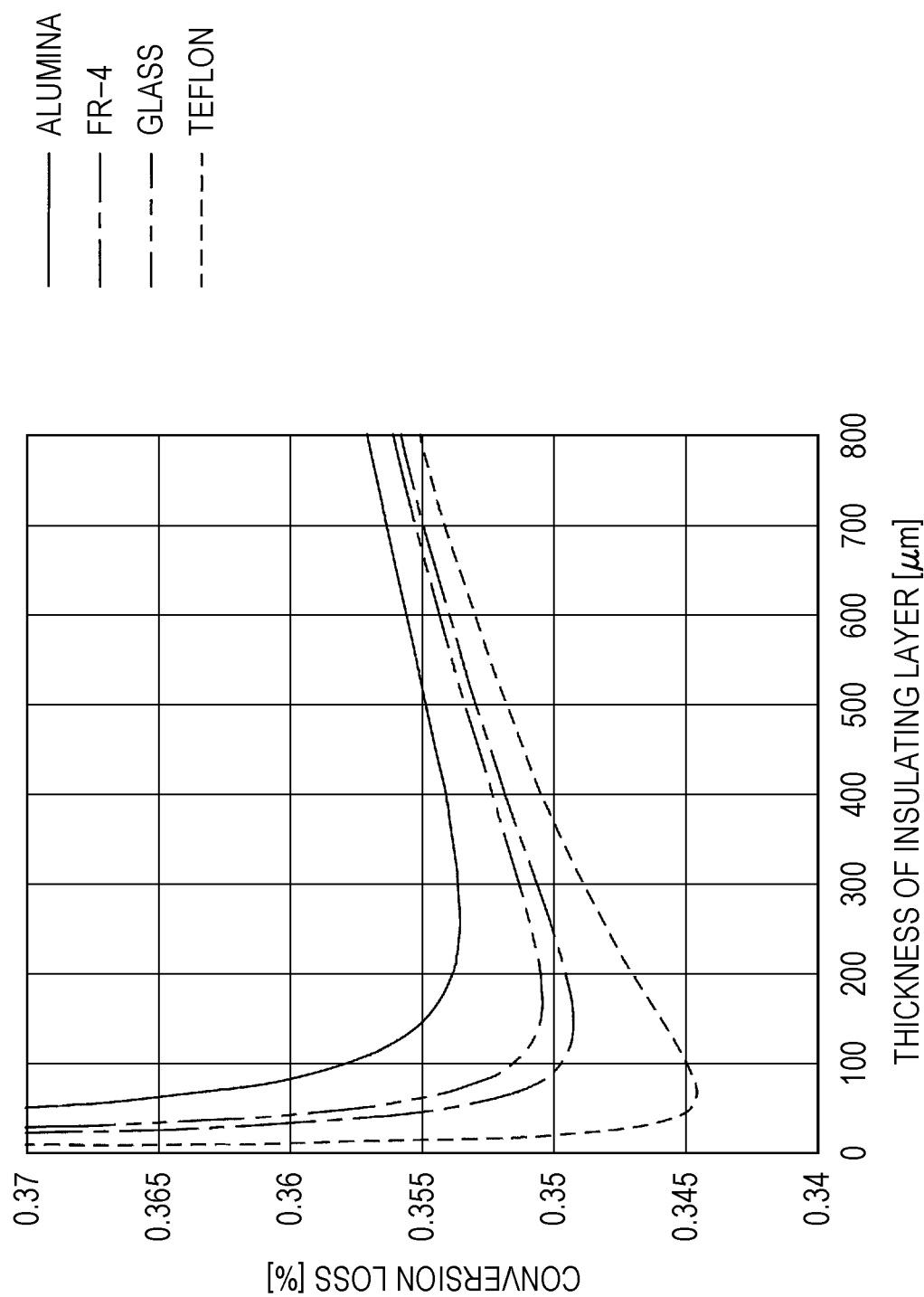
FIG. 9 is a graph indicating a switching loss as a function of the thickness of the insulating layer in the power semiconductor module shown in FIG. 1.

On the other hand, the total switching loss of the power semiconductor module 10 varies as a function of both parasitic inductance and the parasitic capacitance. That is, the thickness of the insulating layer 121 may be optimized from the point of view of minimizing the total switching loss of the power semiconductor module 10. FIG. 9 is a graph indicating the switching loss in the power semiconductor module 10 as a function of the film thickness of the insulating layer 121. In FIG. 9, the switching loss (the conversion loss) is plotted for various materials of the insulating layer 121, and more specifically for alumina, FR-4, glass, and Teflon (registered trademark). For example, in a case where alumina is used as the material of the insulating layer 121, to obtain a small switching loss, it is preferable to set the insulating layer thickness in a range from 100 to 800 μm, more preferably in a range from 125 to 500 μm, and most preferably at 250 μm.

Second Embodiment

In the first embodiment, the power semiconductor module 10 is operated as a down-converter (a voltage step-down circuit) in an electronic device in which the power semiconductor module 10 is installed. Advantageous effects may also be achieved in a case where the power semiconductor module 10 is operated as an up-converter (a voltage step-up circuit) in an electronic device in which the power semiconductor module 10 is installed.

Figure 10:
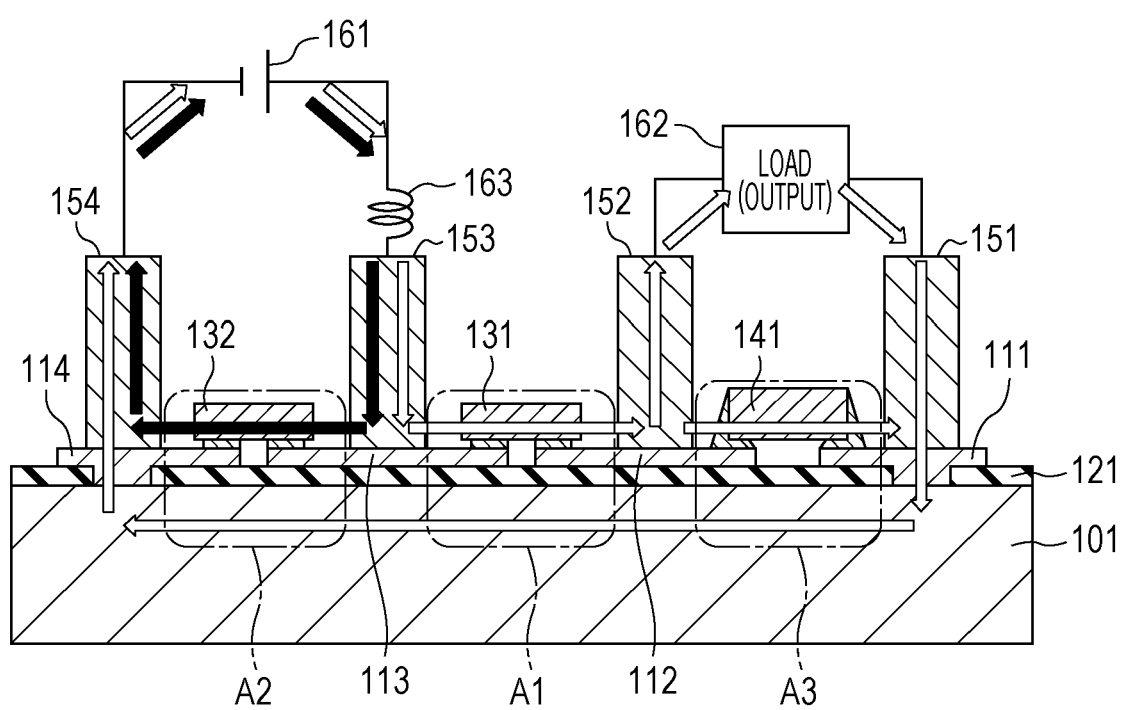
FIG. 10 is a diagram illustrating an effect of reducing switching noise in a case where the power semiconductor module shown in FIG. 1 is operated as an up-converter.

FIG. 10 is a diagram illustrating an effect of reducing switching noise in a case where the power semiconductor module 10 shown in FIG. 1 is operated as an up-converter. In this case, a load 162 of an electronic device is connected to the first terminal group (the first external connection terminal 151 and the second external connection terminal 152) in the power semiconductor module 10, and a power supply 161 and an inductor 163 are connected in series to the second terminal group (the third external connection terminal 153 and the fourth external connection terminal 154). The inductor 163 is disposed between the third external connection terminal 153 and the power supply 162. In the upconverter, in many cases, a smoothing capacitor is connected in parallel to the load 162. However, the smoothing capacitor is not related to the present technical subject, and thus no smoothing capacitor is shown. In FIG. 10, open arrows indicate a path along which a current flows when the first transistor 131 is in the on state (the second transistor 132 is in the off state), while solid arrows indicate a path along which a current flows when the second transistor 132 is in the on state (the first transistor is in the off state).

In the region A1 (extending between the second electrode 112 and the third electrode 113 and further extending partially over the second electrode 112 and the third electrode 113) shown in FIG. 10, cancellation occurs between a magnetic field generated by the current flowing through the first conductive layer and a magnetic field generated by the current flowing through the second conductive layer, and thus a reduction in switching noise generated in these regions is achieved. On the other hand, in the region A2 (extending between the third electrode 113 and the fourth electrode 114 and further extending partially over the third electrode 113 and the fourth electrode 114), currents flow through the first conductive layer and the second conductive layer in the same direction. Note that these currents are supplied from the power supply 161 via the inductor 163. Thus, as for the currents flowing through the first conductive layer and the second conductive layer, the inductor 163 causes changes in current to be suppressed and also cause speeds of the changes to be slowed down such that the changes become small and gradual. As a result, a change in magnetic field caused by switching in the region A2 becomes small. Therefore, in the region A2, even if parasitic inductance exists in either region, the parasitic inductance has a small influence, and thus a reduction in switching noise generated in these regions is achieved.

In the region A3 (extending between the first electrode 111 and the second electrode 112 and further extending partially over the first electrode 111 and the second electrode 112), when the first transistor 131 turns on, a current flows through the second conductive layer (the conductive substrate 101), and, simultaneously, a charging/discharging current occurs in the capacitor 141, which causes a current to flow through the first conductive layer (the first electrode 111 and the second electrode 112). Therefore, in the region A3, cancellation occurs between a magnetic field generated by the current flowing through the first conductive layer and a magnetic field generated by the current flowing through the second conductive layer, and thus a reduction in switching noise generated in these regions is achieved.

As described above, also in the case where the power semiconductor module 10 is operated as the up-converter, switching noise is reduced in all regions A1 to A3 of the power semiconductor module 10 that is, there is no region in which switching noise is not reduced as in the case where the power semiconductor module 10 is operated as the down-converter. That is, the power semiconductor module 10 provides a better switching noise reduction effect than is achieved in the conventional power semiconductor modules.

Third Embodiment

In the first and second embodiments described above, examples of configurations of the power semiconductor module 10 according to the present disclosure have been described. However, the number of semiconductor transistors, the number of external connection terminals, specific circuit configurations, the structures of the power semiconductor module 10 are not limited to those described in the first or second embodiment. In the present disclosure, the power semiconductor module is characterized in that at least one capacitor is disposed on the first conductive layer and a charging/discharging current of this capacitor is used to achieve the magnetic field cancellation, the terminal structure (the layout of external connection terminals) is configured to allow the capacitor to have a charging/discharging current.

In contrast, in a third embodiment described below, two power semiconductor modules 10 according to the first or second embodiment are used to construct a bi-directional DC-DC converter. Note that such a bi-directional DC-DC converter also falls within a scope of the power semiconductor module according to the present disclosure.

Figure 11:
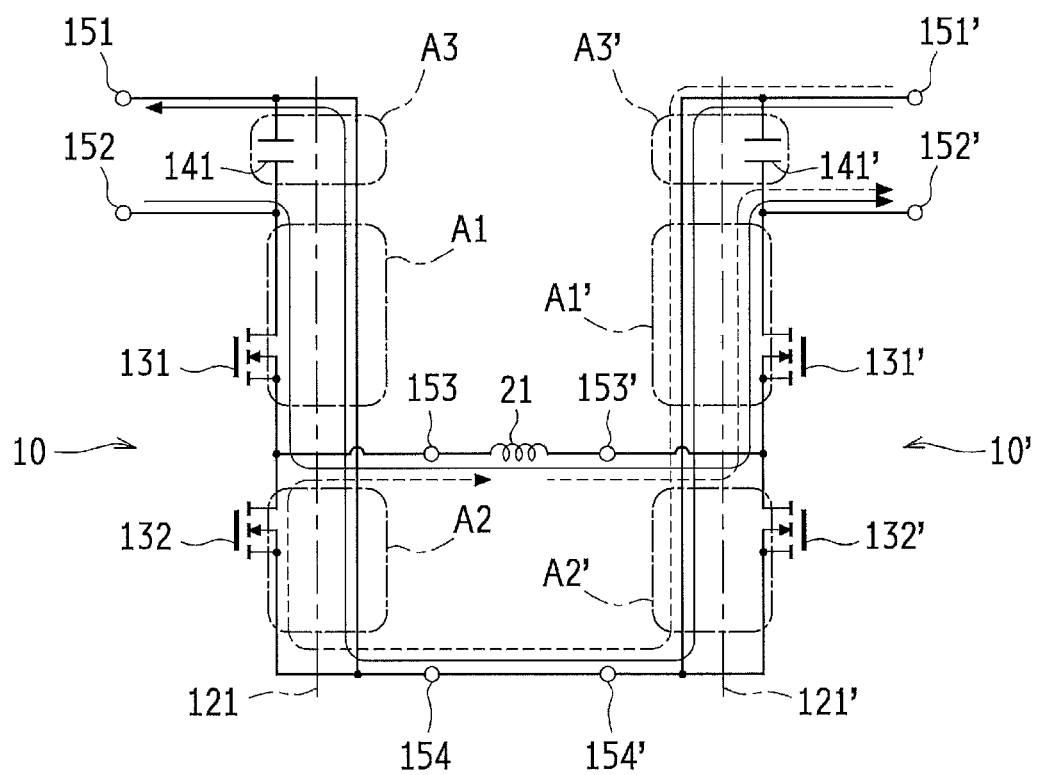
FIG. 11 is a circuit diagram illustrating a configuration of a bi-directional DC-DC converter according to a third embodiment.

FIG. 11 is a circuit diagram illustrating a configuration of a bi-directional DC-DC converter according to a third embodiment. Note that in FIG. 11, power semiconductor modules 10 in the bi-directional DC-DC converter 20 are also represented by equivalent circuits. Also note that in FIG. 11, a symbol ' (prime) is added to an element number of each element in one of the two power semiconductor modules 10 (one on the right-hand side in FIG. 11) to distinguish between the two power semiconductor modules 10 in the bi-directional DC-DC converter 20.

As shown in FIG. 11, in the bi-directional DC-DC converter 20, the second terminal group (the third external connection terminal 153 and the fourth external connection terminal 154) of one power semiconductor module 10 is connected, via the inductor 21, to the second terminal group (the third external connection terminal 153' and the fourth external connection terminal 154') of the other power semiconductor module 10'. The first terminal group (the first external connection terminal 151 and the second external connection terminal 152) of the one power semiconductor module 10 provides input/output terminals of the bi-directional DC-DC converter 20, while the first terminal group (the first external connection terminal 151' and the second external connection terminal 152') of the other power semiconductor module 10' provides output/input terminals of the bi-directional DC-DC converter 20.

In the bi-directional DC-DC converter 20, for example, one power semiconductor module 10 may be disposed at a high voltage side while the other power semiconductor module 10' may be disposed at a low voltage side, and the bi-directional DC-DC converter 20 may be operated as a down-converter from the high voltage side to the low voltage side, while the bi-directional DC-DC converter 20 may be operated as an up-converter from the low voltage side to the high voltage side. First, the power conversion from the high voltage side to the low voltage side is described below. In this case, the first terminal group of the one power semiconductor module 10 is used as input terminals, and the first terminal group of the other power semiconductor module 10' is used as output terminals. Note that, in this case, the first transistor 131' on the low voltage side is fixed in the on state, while the second transistor 132' on the low voltage side is fixed in the off state. The bi-directional DC-DC converter 20 is operated by controlling switching of the first transistor 131 and the second transistor 132 on the high voltage side.

Next, the power conversion in the opposite direction, that is, from the low voltage side to the high voltage side is described. In this case, the first terminal group of one power semiconductor module 10 is used as output terminals, while the first terminal group of the other power semiconductor module 10' is used as input terminals. Note that, also in this case, the first transistor 131' on the low voltage side is fixed in the on state, while the second transistor 132' on the low voltage side is fixed in the off state. The bi-directional DC-DC converter 20 is operated by controlling switching of the first transistor 131 and the second transistor 132 on the high voltage side.

In the bi-directional DC-DC converter 20, one power semiconductor module 10 may be disposed on the low voltage side while the other power semiconductor module 10' may be disposed on the high voltage side. In this case, the first transistor 131 on the low voltage side is fixed in the on state while the second transistor 132 on the low voltage side is fixed in the off state. The bi-directional DC-DC converter 20 is operated by controlling switching of the first transistor 131' and the second transistor 132' on the high voltage side.

FIG. 11 shows a current path in the bi-directional DC-DC converter 20 for a case in which one power semiconductor module 10 is disposed on the high voltage side, the other power semiconductor module 10' is disposed on the low voltage side, and the bi-directional DC-DC converter 20 is operated as a down-converter. In FIG. 11, solid-line arrows indicate a path along which a current flows when the first transistor 131 is in the on state (the second transistor 132 is in the off state), while broken-line arrows indicate a path along which a current flows when the second transistor 132 is in the on state (the first transistor is in the off state).

In the region A1 on the high voltage side and the region A1' on the low voltage side, cancellation occurs between a magnetic field generated by the current flowing through the first conductive layer and a magnetic field generated by the current flowing through the second conductive layer, and thus a reduction in switching noise generated in these regions is achieved. This switching noise reduction effect is similar to that obtained in the region A1 according to the first embodiment described above.

In the region A2 on the high voltage side and the region A2' on the low voltage side, even if parasitic inductance exists in these regions, the parasitic inductance has a small influence, and thus a reduction in switching noise generated in these regions is achieved. This switching noise reduction effect is similar to that obtained in the region A2 according to the first embodiment described above.

In the region A3 on the high voltage side, when the first transistor 131 turns on, a current flows through the second conductive layer and, simultaneously, a charging/discharging current occurs in the capacitor 141, which causes a current to flow through the first conductive layer. Therefore, in the region A3, cancellation occurs between a magnetic field generated by the current flowing through the first conductive layer and a magnetic field generated by the current flowing through the second conductive layer, and thus a reduction in switching noise generated in these regions is achieved. This switching noise reduction effect is similar to that obtained in the region A3 according to the first embodiment described above.

In the region A3' on the low voltage side, a current flows only through the second conductive layer in both a situation in which the first transistor 131 turns on and a situation in which the second transistor 132 turns on. In the region A3', the direction of a current that flows when the first transistor 131 turns on is the same as the direction in which a current flows when the second transistor 132 turns on, and thus no cancellation occurs between magnetic fields generated by these currents. However, these currents flow in the same direction and the two currents occur continuously, and thus, in the region A3', a change in magnetic field caused by switching is small. Therefore, in the region A3', even if parasitic inductance exists in this region, the parasitic inductance has a small influence, and thus a reduction in switching noise generated in these regions is achieved.

Furthermore, in the region A3' on the low voltage side, a magnetic field cancellation effect due to a charging/discharging current of the capacitor 141' is also obtained. Therefore, in the region A3' on the low voltage side, the switching noise reduction effect similar to that obtained in the region A2 according to the first embodiment described above and the switching noise reduction effect similar to that obtained in the region A3 are both obtained.

Figure 12:
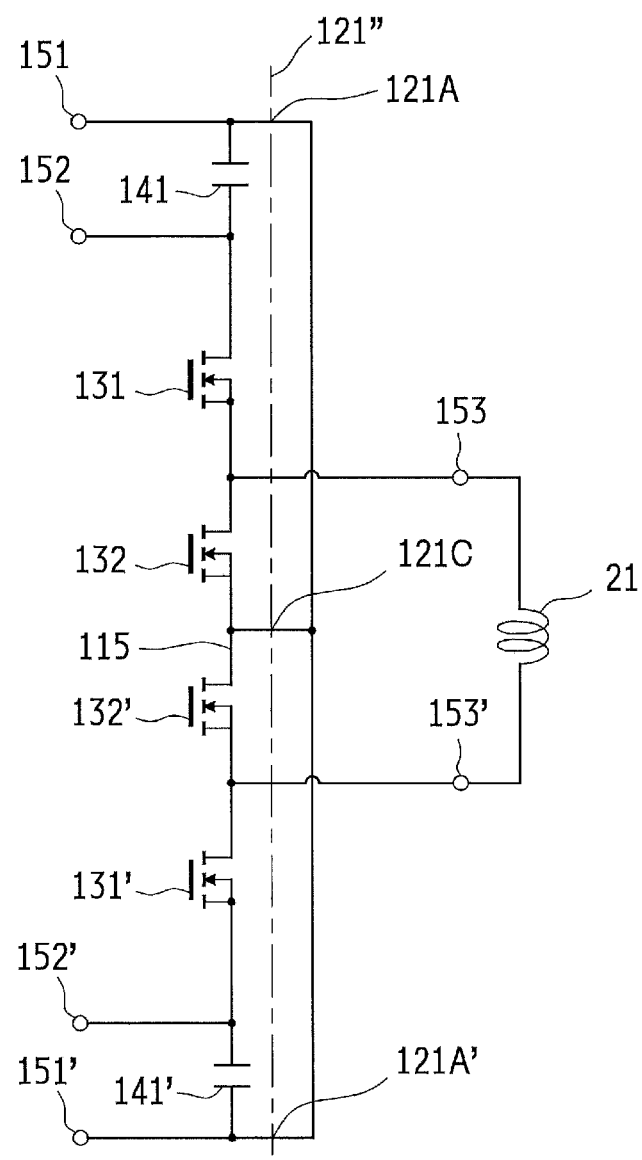
FIG. 12 is a circuit diagram illustrating a configuration of a bi-directional DC-DC converter in which an insulating layer is shared.
Figure 13:
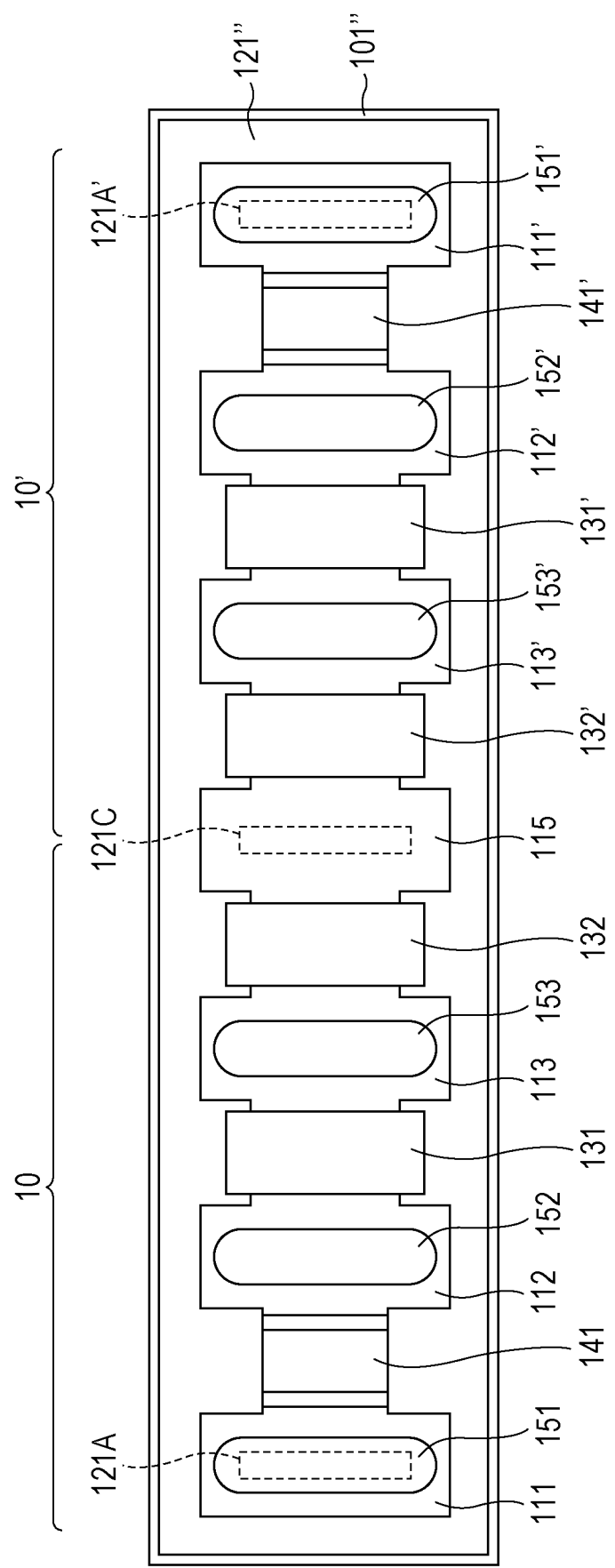
FIG. 13 is a plan view illustrating a configuration of a bi-directional DC-DC converter in which an insulating layer is shared.

In the bi-directional DC-DC converter 20 shown in FIG. 11, the insulating layer 121 of the one power semiconductor module 10 and the insulating layer 121' of the other power semiconductor module 10' may formed with one common insulating layer. FIG. 12 is a circuit diagram illustrating a configuration of the bi-directional DC-DC converter 20 in which the insulating layers 121 and 121' are formed with one common insulating layer. FIG. 13 is a plan view illustrating a configuration of the bi-directional DC-DC converter 20 in which the insulating layers 121 and 121' are formed with one common insulating layer. In this case, in the bi-directional DC-DC converter 20, the insulating layers 121 and 121' are formed into a single common insulating layer 121". Furthermore, in this case, instead of connecting separate fourth external connection terminals 154, that is, the fourth external connection terminal 154 of the one power semiconductor module 10 and the fourth external connection terminal 154' of the other power semiconductor module 10', the fourth electrode 114 of the one power semiconductor module 10 and the fourth electrode 114' of the other power semiconductor module 10' may be formed into a single one fourth electrode 115 on the insulating substrate. Furthermore, the second opening 121B of the power semiconductor module 10 and the second opening 121B' of the power semiconductor module 10' may be formed into one single second opening 121C for common use.

Furthermore, in the bi-directional DC-DC converter 20 shown in FIG. 13, not only the insulating layer 121" but the second conductive layer is also shared for common use. More specifically, the conductive substrate 101 of the one power semiconductor module 10 and the conductive substrate 101' of the other power semiconductor module 10' may be formed into a single conductive substrate 101" for common use. In the configuration in which the second conductive layer is shared, it may be preferable that a current flowing through the second conductive layer between the first opening 121A and the second opening 121C does not cross a current flowing through the second conductive layer between the first opening 121A' and the second opening 121C in the power semiconductor module 10'. For example, in a case where elements are disposed along a straight line as shown in FIG. 12, it is possible to achieve common use between the second conductive layer of the power semiconductor module 10 and the second conductive layer of the power semiconductor module 10'.

Note that all embodiments described above are for illustration but not limitation. That is, the scope of the present disclosure is not limited by the embodiments but is defined in the appended claims. Note that many modifications are possible without departing from the spirit and the scope of the present disclosure.

The present disclosure contains subject matter related to that disclosed in Japanese Priority Patent Application JP 2017-219666 filed in the Japan Patent Office on Nov. 15, 2017, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for controlling power semiconductor module comprising:

an insulating layer;
a first conductive layer including a plurality of electrodes and formed on one of principal surfaces of the insulating layer; and
a second conductive layer formed on the other one of principal surfaces of the insulating layer,
wherein the first conductive layer and the second conductive layer are connected to each other via an opening formed in the insulating layer,
a plurality of switching devices and a plurality of external connection terminals are disposed on a surface of the first conductive layer, the method comprising:
performing power conversion by switching a current path by controlling switching of the switching devices,
in performing the power conversion, the switching of the switching devices is controlled such that two current paths are continuously and alternately switched,
in one of two current paths, a current flows only through the first conductive layer,
in the other one of two current paths, a current flows only through the second conductive layer, and
the power semiconductor module includes a region in which the two currents flow in the same direction.

2. A power semiconductor module comprising:
an insulating layer;
a first conductive layer formed on one of principal surfaces of the insulating layer and including a plurality of electrodes; and
a second conductive layer formed on the other one of the principal surfaces of the insulating layer,
the first conductive layer comprising
  a first electrode connected to the second conductive layer via a first opening formed in the insulating layer,
  a second electrode and a third electrode either of which is not connected to the second conductive layer, and
  a fourth electrode connected to the second conductive layer via a second opening formed in the insulating layer,
the power semiconductor module further comprising:
  a capacitor connected between the first electrode and the second electrode;
  a first transistor connected between the second electrode and the third electrode;
  a second transistor connected between the third electrode and the fourth electrode; and
  first to fourth external connection terminals respectively connected to the first to fourth electrodes.

3. The power semiconductor module according to claim 2, wherein the first to fourth electrodes are arranged in one substantially straight line in the order from the first to fourth electrodes.

4. The power semiconductor module according to claim 2, wherein the first transistor and the second transistor are mounted on the power semiconductor module using a flip-chip bonding technique.

5. The power semiconductor module according to claim 2, wherein the first transistor and the second transistor are each a lateral semiconductor transistor.

6. The power semiconductor module according to claim 2, wherein
in the first electrode, the first external connection terminal is disposed immediately above the first opening, and
in the fourth electrode, the fourth external connection terminal is disposed immediately above the second opening.

7. The power semiconductor module according to claim 2, wherein the insulating layer is made using alumina, and the thickness of the insulating layer is in a range from 100 to 800 m.

8. An electronic device including the power semiconductor module according to claim 2.

* * * * *